United States Patent
Fu

(10) Patent No.: US 11,947,250 B2
(45) Date of Patent: Apr. 2, 2024

(54) WAVELENGTH CONVERSION ELEMENT WITH HEAT CONDUCTIVE LAYER AND PROJECTOR

(71) Applicant: Coretronic Corporation, Hsin-Chu (TW)

(72) Inventor: Tsung-Hsiang Fu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/371,129

(22) Filed: Jul. 9, 2021

(65) Prior Publication Data
US 2022/0029072 A1 Jan. 27, 2022

(30) Foreign Application Priority Data
Jul. 24, 2020 (CN) .......................... 202010720584.5

(51) Int. Cl.
*G03B 21/20* (2006.01)
*G03B 21/16* (2006.01)
*H01L 33/50* (2010.01)

(52) U.S. Cl.
CPC ........... *G03B 21/204* (2013.01); *G03B 21/16* (2013.01); *G03B 21/2066* (2013.01); *H01L 33/504* (2013.01); *H01L 33/507* (2013.01)

(58) Field of Classification Search
CPC ................ G03B 21/204; H01L 33/50–508
See application file for complete search history.

(56) References Cited

U.S. PATENT DOCUMENTS

2015/0205189 A1* 7/2015 Nojima ............... H01L 33/50
  353/31
2015/0308637 A1 10/2015 Chang et al.
2015/0316233 A1* 11/2015 Kawamata ............. F21V 13/08
  29/428

(Continued)

FOREIGN PATENT DOCUMENTS

CN  203489181  3/2014
CN  204879969  12/2015

(Continued)

OTHER PUBLICATIONS

"Office Action of China Counterpart Application", dated Jun. 6, 2022, p. 1-p. 14.

*Primary Examiner* — Bao-Luan Q Le
(74) *Attorney, Agent, or Firm* — JCIPRNET

(57) ABSTRACT

A wavelength conversion element is provided. The wavelength conversion element includes a substrate, a wavelength conversion layer, a reflective layer, and a heat conductive layer. The wavelength conversion layer is disposed on the substrate. The reflective layer is disposed on the substrate and is located between the substrate and the wavelength conversion layer. The heat conductive layer is disposed on the substrate, and at least a portion of the heat conductive layer is located between the substrate and the reflective layer. A projector is also provided, and the projector includes the wavelength conversion element. The wavelength conversion element exhibits a favorable heat dissipation effect and provides improved conversion efficiency, so that the projector exhibits favorable projection quality and product competitiveness.

29 Claims, 6 Drawing Sheets

(56) References Cited

U.S. PATENT DOCUMENTS

| | | | |
|---|---|---|---|
| 2016/0040857 A1* | 2/2016 | Inoue | F21V 13/14 |
| | | | 362/343 |
| 2016/0077415 A1* | 3/2016 | Motoya | G03B 21/204 |
| | | | 427/157 |
| 2017/0015901 A1* | 1/2017 | Lenef | C04B 37/028 |
| 2018/0356715 A1* | 12/2018 | Kobayashi | H04N 9/3158 |
| 2019/0146318 A1* | 5/2019 | Hsieh | G03B 21/204 |
| | | | 362/84 |
| 2019/0179219 A1* | 6/2019 | Takagi | B32B 37/18 |
| 2019/0187545 A1* | 6/2019 | Arakawa | H04N 9/3164 |
| 2019/0331989 A1* | 10/2019 | Chen | G03B 21/204 |
| 2021/0096357 A1* | 4/2021 | Li | G03B 21/16 |
| 2021/0098657 A1* | 4/2021 | Ito | G03B 21/204 |
| 2021/0098662 A1* | 4/2021 | Li | H01L 33/644 |
| 2021/0108767 A1* | 4/2021 | Li | F21V 29/503 |
| 2021/0223672 A1* | 7/2021 | Yokoo | G03B 21/204 |

FOREIGN PATENT DOCUMENTS

| | | |
|---|---|---|
| CN | 108351584 | 7/2018 |
| CN | 208239722 | 12/2018 |
| CN | 109654391 | 4/2019 |
| CN | 109751563 | 5/2019 |
| CN | 110017435 | 7/2019 |
| CN | 110579933 | 12/2019 |
| CN | 110873319 | 3/2020 |
| CN | 110887022 | 3/2020 |
| CN | 111103748 | 5/2020 |
| CN | 111123630 | 5/2020 |
| TW | 202024679 | 7/2020 |
| WO | 2017110031 | 6/2017 |

\* cited by examiner

WAVELENGTH CONVERSION ELEMENT WITH HEAT CONDUCTIVE LAYER AND PROJECTOR

CROSS-REFERENCE TO RELATED APPLICATION

This application claims the priority benefit of China application serial no. 202010720584.5, filed on Jul. 24, 2020. The entirety of the above-mentioned patent application is hereby incorporated by reference herein and made a part of this specification.

BACKGROUND

Technical Field

The disclosure relates to an optical element and a projector, and in particular, relates to a wavelength conversion element and a projector with this wavelength conversion element.

Description of Related Art

In a solid state illumination (SSI) projector apparatus, laser can be used as the light source. The phosphor wheel is located on the transmission path of the illumination light beam of the light source module. The blue laser light source is projected on the light conversion region of the phosphor wheel through the lens, so as to excite the yellow light source to achieve light combination. Generally, the temperature on the phosphor wheel may be conducted to the aluminum alloy substrate with high thermal conductivity, and that heat generated by the phosphor wheel when being excited may be dissipated accordingly. Nevertheless, the substrate with high thermal conductivity require high manufacturing costs and thus are less suitable for mass production. Further, the hardness of the substrate with high thermal conductivity is also higher, and a less favorable processability is therefore provided.

The information disclosed in this BACKGROUND section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a wavelength conversion element exhibiting a favorable heat dissipation effect and providing improved conversion efficiency. The disclosure also provides a projector including the wavelength conversion element and exhibiting favorable projection quality and product competitiveness.

Other objects and advantages of the disclosure can be further illustrated by the technical features broadly embodied and described as follows.

In order to achieve one or a portion of or all of the objects or other objects, an embodiment of the disclosure provides a wavelength conversion element including a substrate, a wavelength conversion layer, a reflective layer, and a heat conductive layer. The wavelength conversion layer is disposed on the substrate. The reflective layer is disposed on the substrate and is located between the substrate and the wavelength conversion layer. The heat conductive layer is disposed on the substrate, and at least a portion of the heat conductive layer is located between the substrate and the reflective layer.

In order to achieve one or a portion of or all of the objects or other objects, an embodiment of the disclosure provides a projector including a light-emitting unit, a wavelength conversion element, a light valve, and a projection lens. The light-emitting unit is configured to emit an illumination light beam. The wavelength conversion element is disposed on a transmission path of the illumination light beam. The wavelength conversion element includes a substrate, a wavelength conversion layer, a reflective layer, and a heat conductive layer. The wavelength conversion layer is disposed on the substrate. The reflective layer is disposed on the substrate and is located between the substrate and the wavelength conversion layer. The heat conductive layer is disposed on the substrate, and at least a portion of the heat conductive layer is located between the substrate and the reflective layer. The light valve is disposed on the transmission path of the illumination light beam and is configured to convert the illumination light beam into an image light beam. The projection lens is disposed on a transmission path of the image light beam and is configured to project the image light beam.

Based on the above, the embodiments of the invention have at least one of the following advantages or effects. In the design of the wavelength conversion element provided by the disclosure, at least a portion of the heat conductive layer is located between the substrate and the reflective layer. In this way, the thermal conductivity of the wavelength conversion element is increased, and that conversion efficiency of the wavelength conversion element is further enhanced. In addition, the projector adopting the wavelength conversion element provided by the disclosure may feature favorable projection quality and product competitiveness.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
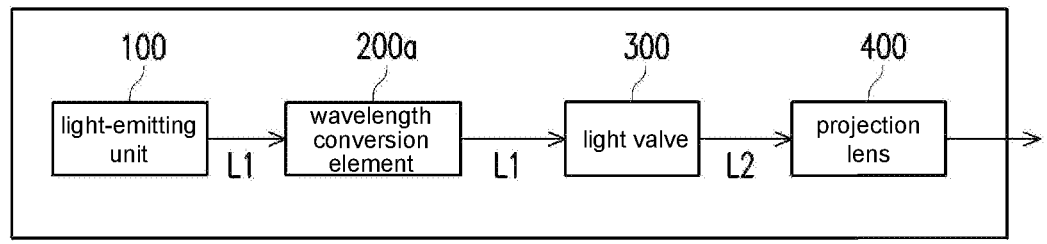
FIG. 1A is a schematic view of a projection apparatus according to an embodiment of the disclosure.

FIG. 1A is a schematic view of a projection apparatus according to an embodiment of the disclosure. With reference to FIG. 1, in the present embodiment, a projector 10 includes a light-emitting unit 100, a wavelength conversion element 200a, a light valve 300, and a projection lens 400. The light-emitting unit 100 is configured to emit an illumination light beam L1, and the wavelength conversion element 200a is disposed on a transmission path of the illumination light beam L1. The light valve 300 is disposed on the transmission path of the illumination light beam L1 and is configured to convert the illumination light beam L1 into an image light beam L2. The projection lens 400 is disposed on a transmission path of the image light beam L2 and is configured to project the image light beam L2.

To be specific, the light-emitting unit 100 provided by this embodiment includes, for example, a laser diode (LD) such as a laser diode bank. Specifically, light sources that meet the volume requirements may all be implemented according to actual design, and the disclosure is not limited thereto. The light valve 300 includes, for example, a reflective light modulator such as a liquid crystal on Silicon panel (LCoS) panel and a digital micro-mirror device (DMD). In an embodiment, the light valve 300 includes, for example, a transmissive light modulator such as a transparent liquid crystal panel, an electro-optical modulator, a magneto-optic modulator, and an acousto-optic modulator (AOM), but a form and a type of the light valve 300 is not particularly limited in the present embodiment. Detailed steps and implementation of a method of converting the illumination light beam L1 into the image light beam L2 by the light valve 300 may be obtained through sufficient teachings, suggestions, and other details in the art, and that repeated description is not provided herein. In addition, the projection lens 400 includes, for example, one or a plurality of optical lens combinations with identical or different refracting powers including various non-planar lens combinations of a biconcave lens, a biconvex lens, a concave-convex lens, a convex-concave lens, a plane-convex lens, and a plane-concave lens, for example. In an embodiment, the projection lens 400 may also include a planar optical lens to project the image light beam L2 out of the projector 10 through a reflective or penetrative manner. Herein, a form and a type of the projection lens 400 is not particularly limited in the present embodiment.

Figure 1B:
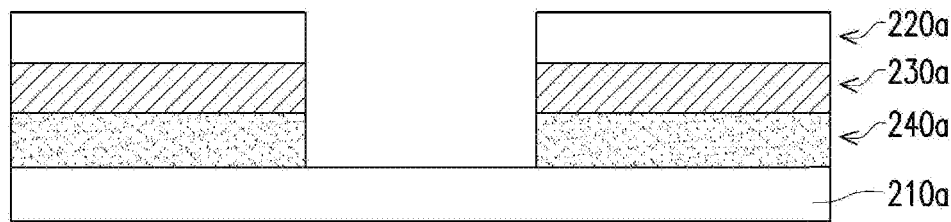
FIG. 1B is a cross-sectional schematic view of a wavelength conversion element of the projection apparatus of FIG. 1A.

FIG. 1B is a cross-sectional schematic view of a wavelength conversion element of the projection apparatus of FIG. 1A. With reference to FIG. 1B, in this embodiment, the wavelength conversion element 200a includes a substrate 210a, a wavelength conversion layer 220a, a reflective layer 230a, and a heat conductive layer 240a. The wavelength conversion layer 220a and the reflective layer 230a are both disposed on the substrate 210a, and the reflective layer 230a is located between the substrate 210a and the wavelength conversion layer 220a. The heat conductive layer 240a is disposed on the substrate 210a, and at least a portion of the heat conductive layer 240a is located between the substrate 210a and the reflective layer 230a. As shown in the embodiment of FIG. 1B, the heat conductive layer 240a directly contacts the substrate 210a and directly contacts the reflective layer 230a. In this case, thermal energy generated by the wavelength conversion layer 220a during excitation may be transmitted to the substrate 210a through the reflective layer 230a and the heat conductive layer 240a. As shown in FIG. 1B, an orthogonal projection of the heat conductive layer 240a on the substrate 210a is less than the substrate 210a and completely overlaps an orthogonal projection of the reflective layer 230a on the substrate 210a and an orthogonal projection of the wavelength conversion layer 220a on the substrate 210a. For instance, an area of the orthogonal projection of the heat conductive layer 240a on the substrate 210a is less than an area of the substrate 210a. Nevertheless, the disclosure is not limited thereto.

In some embodiments, the substrate 210a is, for example, a heat dissipation substrate, and a material thereof is, for example, aluminum, but is not limited thereto. The heat conductive layer 240a includes a heat conductive material and a filler material. A thermal conductivity coefficient of the heat conductive material is between 200 W/m·K and 5000 W/m·K. Further, the heat conductive material may be solid at room temperature and may be, for example, graphene, diamond, silver, copper, aluminum, gold, silicon carbide, or a combination of the foregoing. The filler material may be non-solid at room temperature and may be, for example, silicon dioxide colloid, zirconium dioxide colloid, silicone resin, epoxy resin, ceramic resin, silicone, silica sol, silicate, phosphate, sulfate, borate, or a combination of the foregoing, but is not limited thereto. The heat conductive material and the filler material are mixed to form a heat conductive layer coating. The filler material in the heat conductive layer coating is cured through a curing process, and the heat conductive layer 240a is then formed. Since a thermal conductivity of the heat conductive material is approximately 20 times greater than that of a general heat conductive substrate, so that the heat conductive layer 240a may achieve a favorable heat conduction effect. Accordingly, in this embodiment, a conventional substrate with high costs and a high thermal conductivity is not required to be adopted, and that the problem of processing difficulty caused by excessive hardness of a heat conductive substrate featuring high thermal conductivity is also prevented.

In this embodiment, since at least a portion of the heat conductive layer 240a is located between the substrate 210a and the reflective layer 230a, a heat conduction effect of the substrate 210a is improved. Accordingly, a thermal conductivity of the wavelength conversion element 200a is improved, and that optical conversion efficiency of the wavelength conversion element 200a is further enhanced. As such, the projector 10 adopting the wavelength conversion element 200a provided by this embodiment may feature favorable projection quality and product competitiveness.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 2:
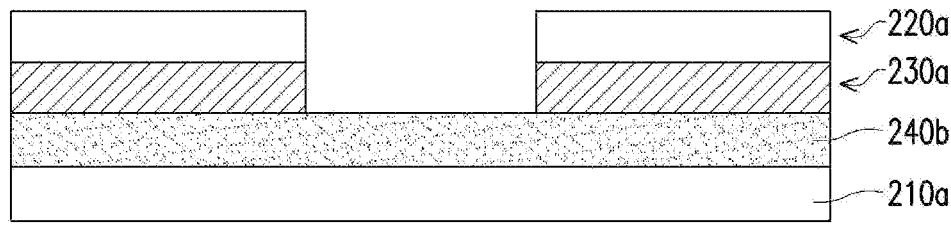
FIG. 2 to FIG. 16 are cross-sectional schematic views each illustrating a wavelength conversion element according to the embodiments of the disclosure.

FIG. 2 is a cross-sectional schematic view illustrating a wavelength conversion element according to an embodiment of the disclosure. With reference to FIG. 1B and FIG. 2, a wavelength conversion element 200b provided by this embodiment is similar to the wavelength conversion element 200a provided by FIG. 1B, and a difference therebetween is that an orthogonal projection of a heat conductive layer 240b of the wavelength conversion element 200b on the substrate 210a is greater than the orthogonal projection of the reflective layer 230a on the substrate 210a. Specifically, the orthogonal projection of the heat conductive layer 240b on the substrate 210a completely overlaps the substrate 210a, and the orthogonal projection of the reflective layer 230a on the substrate 210a completely overlaps the orthogonal projection of the wavelength conversion layer 220a on the substrate 210a. That is, the heat conductive layer 240b is distributed on the entire substrate 210a, so that thermal energy may be additionally diffused to a non-wavelength conversion region before being transmitted to the substrate 210a. That is, an area of heat conduction to the substrate 210a is expanded, so that the heat conduction effect is further enhanced.

Figure 3:
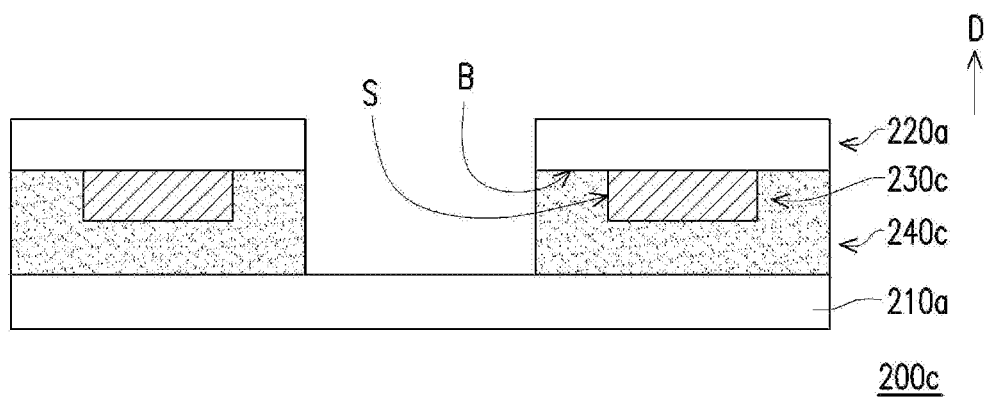

FIG. 3 is a cross-sectional schematic view illustrating a wavelength conversion element according to another embodiment of the disclosure. With reference to FIG. 2 and FIG. 3, a wavelength conversion element 200c provided by this embodiment is similar to the wavelength conversion element 200b provided by FIG. 2, and a difference therebetween is that a heat conductive layer 240c extends and covers a side surface S of a reflective layer 230c in a direction D parallel to an optical axis of excitation light of the wavelength conversion layer 220a. Specifically, in this embodiment, the heat conductive layer 240c contacts a bottom surface B of the wavelength conversion layer 220a, and an orthogonal projection of the heat conductive layer 240c on the substrate 210a completely overlaps the orthogonal projection of the wavelength conversion layer 220a on the substrate 210a.

In the present embodiment, since the heat conductive layer 240c may directly contact the bottom surface B of the wavelength conversion layer 220a, the thermal energy generated by the wavelength conversion layer 220a during excitation may be directly transmitted to the substrate 210a, and that a favorable heat conduction effect is provided. In addition, since the heat conductive layer 240c may also contact the side surface S of the reflective layer 230c directly, thermal energy accumulated by the reflective layer 230c may also be transmitted to the substrate 210a from a lateral side, and that the heat conduction effect provided by the wavelength conversion element 200c is further enhanced.

Figure 4:
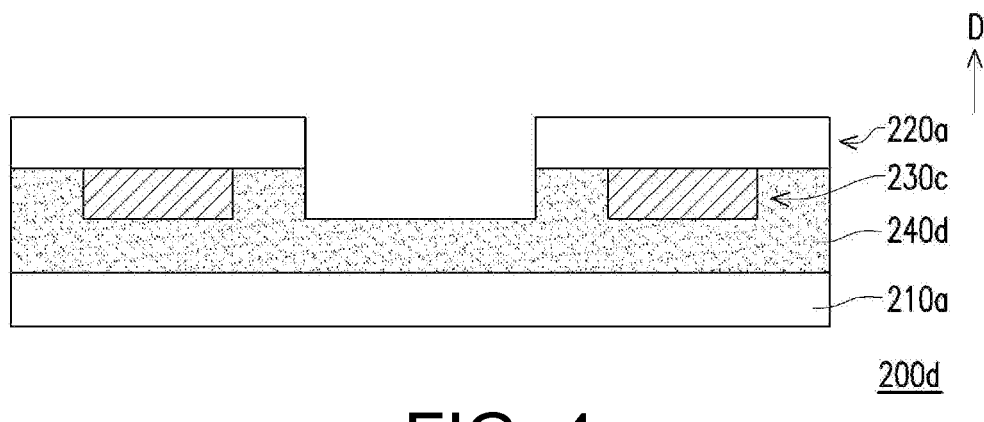

FIG. 4 is a cross-sectional schematic view illustrating a wavelength conversion element according to another embodiment of the disclosure. With reference to FIG. 3 and FIG. 4, a wavelength conversion element 200d provided by this embodiment is similar to the wavelength conversion element 200c provided by FIG. 3, and a difference therebetween is that an orthogonal projection of a heat conductive layer 240d on the substrate 210a completely overlaps the substrate 210a in this embodiment. Since the heat conductive layer 240d is distributed on the entire substrate 210a, so that thermal energy may be additionally diffused to a non-wavelength conversion region before being transmitted to the substrate 210a. That is, an area of heat conduction to the substrate 210a is expanded, so that the heat conduction effect is further enhanced.

Figure 5:
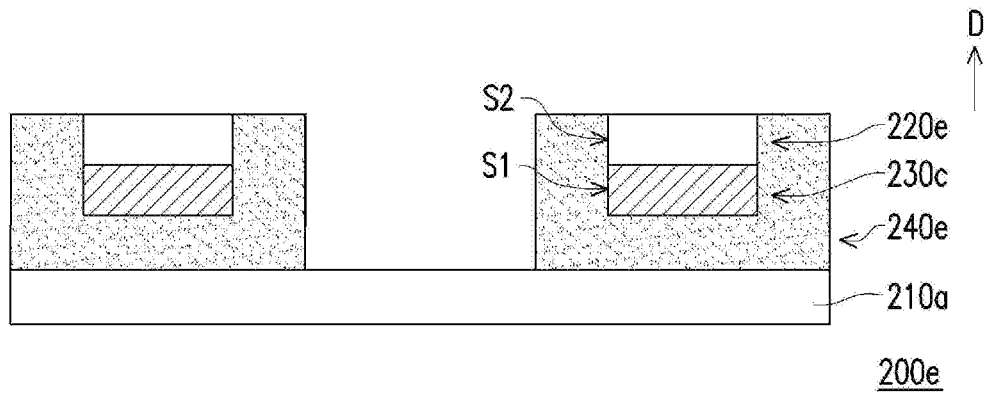

FIG. 5 is a cross-sectional schematic view illustrating a wavelength conversion element according to another embodiment of the disclosure. With reference to FIG. 1B and FIG. 5, a wavelength conversion element 200e provided by this embodiment is similar to the wavelength conversion element 200a provided by FIG. 1B, and a difference therebetween is that an orthogonal projection of a heat conductive layer 240e on the substrate 210a is greater than an orthogonal projection of the reflective layer 230c on the substrate 210a and an orthogonal projection of a wavelength conversion layer 220e on the substrate 210a in this embodiment. Specifically, the heat conductive layer 240e extends and covers a first side surface 51 of a reflective layer 230e and a second side surface S2 of the wavelength conversion layer 220e in a direction D parallel to an optical axis of excitation light of the wavelength conversion layer 220e. That is, the heat conductive layer 240e may be distributed on the second side surface S2 of the wavelength conversion layer 220e, so that thermal energy generated by the wavelength conversion layer 220e during excitation may be directly transmitted to the substrate 210a, and that a favorable heat conduction effect is provided. In addition, since the heat conductive layer 240e may directly contact the first side surface 51 of the reflective layer 230c, the thermal energy accumulated by the reflective layer 230c may also be transmitted to the substrate 210a from a lateral side, and that the heat conduction effect provided by the wavelength conversion element 200e is further enhanced.

Figure 6:
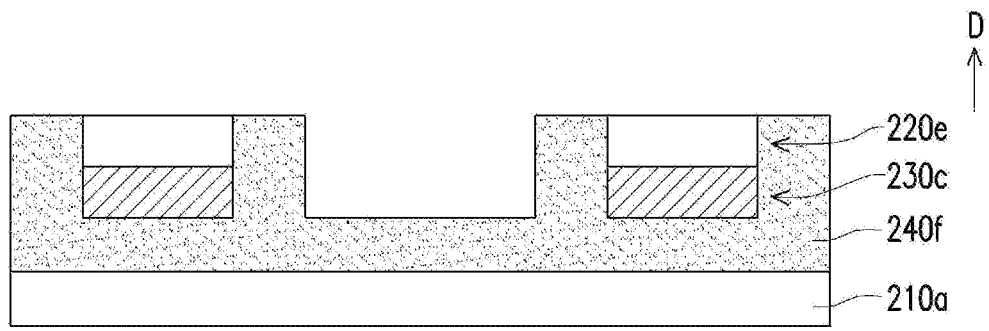

FIG. 6 is a cross-sectional schematic view illustrating a wavelength conversion element according to another embodiment of the disclosure. With reference to FIG. 5 and FIG. 6, a wavelength conversion element 200f provided by this embodiment is similar to the wavelength conversion element 200e provided by FIG. 5, and a difference therebetween is that an orthogonal projection of a heat conductive layer 240f on the substrate 210a completely overlaps the substrate 210a in this embodiment. Since the heat conductive layer 240f is distributed on the entire substrate 210a, so that thermal energy may be additionally diffused to a non-wavelength conversion region before being transmitted to the substrate 210a. That is, an area of heat conduction to the substrate 210a is expanded, so that the heat conduction effect is further enhanced.

Figure 7:
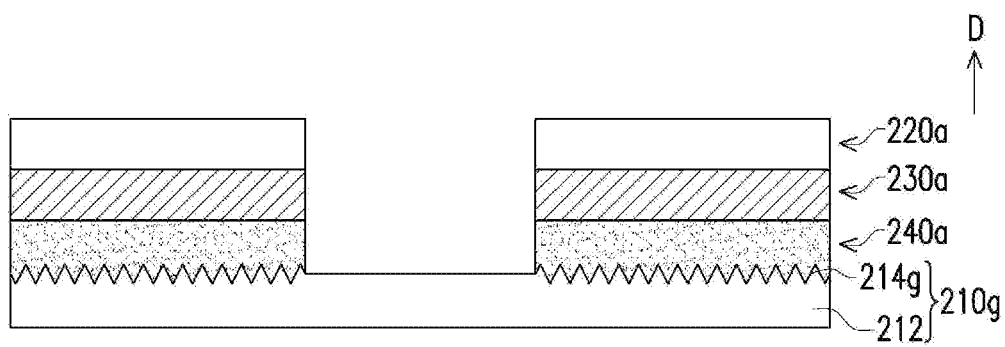

FIG. 7 is a cross-sectional schematic view illustrating a wavelength conversion element according to another embodiment of the disclosure. With reference to FIG. 1B and FIG. 7, a wavelength conversion element 200g provided by this embodiment is similar to the wavelength conversion element 200a provided by FIG. 1B, and a difference therebetween is that in this embodiment, a substrate 210g includes a base board 212 and a surface treatment layer 214g, and at least a portion of the surface treatment layer 214g is located between the heat conductive layer 240a and the base board 212. Herein, a material of the base board 212 is, for example, aluminum, and a material of the surface treatment layer 214g is a porous material. The surface treatment layer 214g has a non-smooth surface, exhibits a reflective property, is preferably made of alumina, and may be obtained by oxidizing the material of the base board 212 itself, but is not limited thereto. Specifically, in this embodiment, an orthogonal projection of the surface treatment layer 214g on the base board 212 is less than the base board 212, and the orthogonal projection of the surface treatment layer 214g on the base board 212 completely overlaps an orthogonal projection of the heat conductive layer 240a on the base board 212. The orthogonal projection of the surface treatment layer 214g on the base board 212 completely overlaps an orthogonal projection of the reflective layer 230a on the base board 212 and an orthogonal projection of the wavelength conversion layer 220a on the base board 212.

In this embodiment, since the surface treatment layer 214g exhibits a reflective property, excitation light or by laser light leaked by the reflective layer 230a may be reflected, so that light utilization efficiency is improved, and a layer in contact with the surface treatment layer 214g may also be securely fixed. When being coated and formed on the surface treatment layer 214g, the heat conductive layer 240a may fill a surface and an inner portion of the surface treatment layer 214g, so that the heat conduction effect provided by the surface treatment layer 214g is further improved. In this way, the thermal energy generated by the wavelength conversion layer 220a during excitation may be easily transmitted to the substrate 210g.

Figure 8:
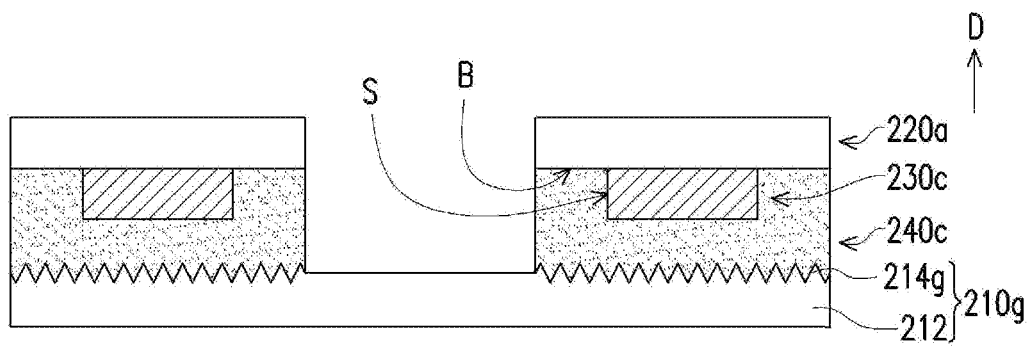

FIG. 8 is a cross-sectional schematic view illustrating a wavelength conversion element according to another embodiment of the disclosure. With reference to FIG. 7 and FIG. 8, a wavelength conversion element 200h provided by this embodiment is similar to the wavelength conversion element 200g provided by FIG. 7, and a difference therebetween is that the heat conductive layer 240c extends and covers the side surface S of the reflective layer 230c and contacts the bottom surface B of the wavelength conversion layer 220a in the direction D parallel to the optical axis of the excitation light of the wavelength conversion layer 220a. Specifically, an orthogonal projection of the heat conductive layer 240c on the base board 212 completely overlaps the orthogonal projection of the wavelength conversion layer 220a on the base board 212.

In the present embodiment, since the heat conductive layer 240c may directly contact the bottom surface B of the wavelength conversion layer 220a, the thermal energy generated by the wavelength conversion layer 220a during excitation may be directly transmitted to a substrate 210g, and that a favorable heat conduction effect is provided. In addition, since the heat conductive layer 240c may directly contact the side surface S of the reflective layer 230c, the thermal energy accumulated by the reflective layer 230c may also be transmitted to the substrate 210g from a lateral side, and that the heat conduction effect provided by the wavelength conversion element 200h is further enhanced.

Figure 9:
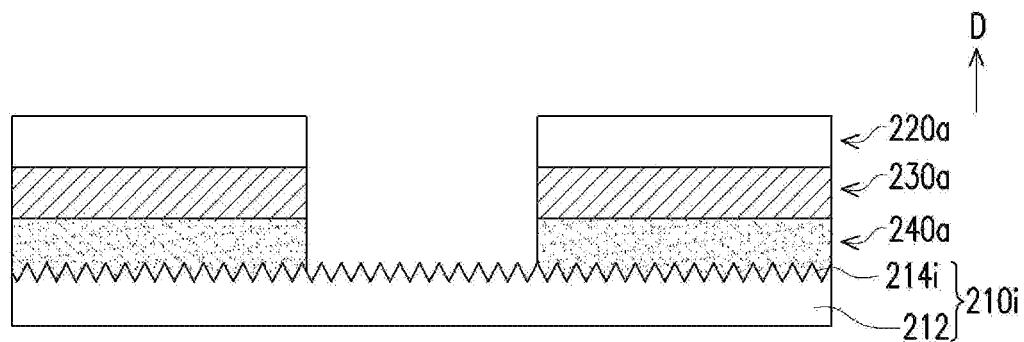

FIG. 9 is a cross-sectional schematic view illustrating a wavelength conversion element according to another embodiment of the disclosure. With reference to FIG. 7 and FIG. 9, a wavelength conversion element 200i provided by this embodiment is similar to the wavelength conversion element 200g provided by FIG. 7, and a difference therebetween is that in this embodiment, a substrate 210i includes the base board 212 and a surface treatment layer 214i, and an orthogonal projection of the surface treatment layer 214i on the base board 212 completely overlaps the base board 212. Therefore, the orthogonal projection of the heat conductive layer 240a on the base board 212 is less than the base board 212 and completely overlaps the orthogonal projection of the reflective layer 230a on the base board 212 and the orthogonal projection of the wavelength conversion layer 220a on the base board 212.

Figure 10:
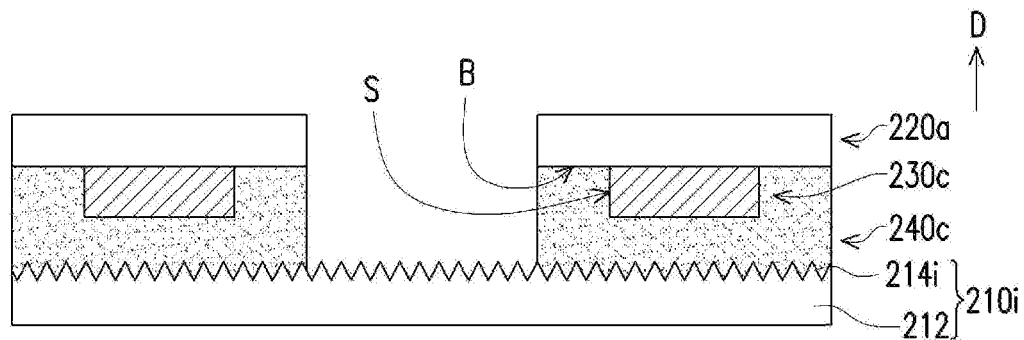

FIG. 10 is a cross-sectional schematic view illustrating a wavelength conversion element according to another embodiment of the disclosure. With reference to FIG. 9 and FIG. 10, a wavelength conversion element 200j provided by this embodiment is similar to the wavelength conversion element 200i provided by FIG. 9, and a difference therebetween is that the heat conductive layer 240c extends and covers the side surface S of the reflective layer 230c and contacts the bottom surface B of the wavelength conversion layer 220a in the direction D parallel to the optical axis of the excitation light of the wavelength conversion layer 220a. Specifically, the orthogonal projection of the heat conductive layer 240c on the base board 212 is less than the base board 212, and the orthogonal projection of the heat conductive layer 240c on the base board 212 completely overlaps the orthogonal projection of the wavelength conversion layer 220a on the base board 212.

In the present embodiment, since the heat conductive layer 240c may directly contact the bottom surface B of the wavelength conversion layer 220a, the thermal energy generated by the wavelength conversion layer 220a during excitation may be directly transmitted to a substrate 210i, and that a favorable heat conduction effect is provided. In addition, since the heat conductive layer 240c may directly contact the side surface S of the reflective layer 230c, the thermal energy accumulated by the reflective layer 230c may also be transmitted to the substrate 210i from a lateral side, and that the heat conduction effect provided by the wavelength conversion element 200j is further enhanced.

Figure 11:
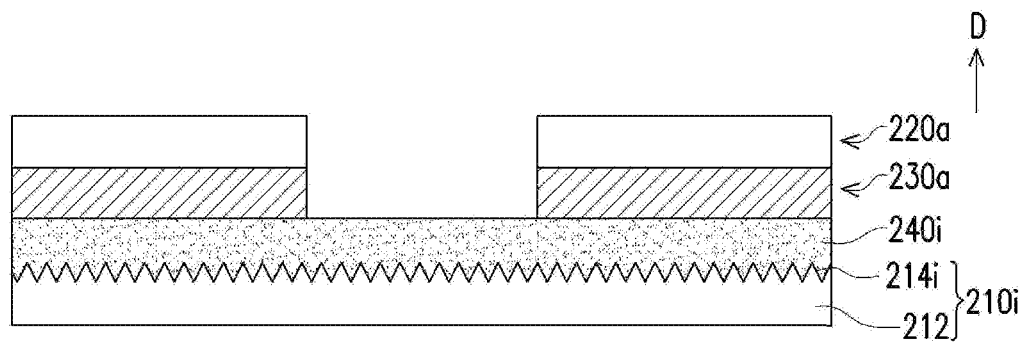

FIG. 11 is a cross-sectional schematic view illustrating a wavelength conversion element according to another embodiment of the disclosure. With reference to FIG. 9 and FIG. 11, a wavelength conversion element 200k provided by this embodiment is similar to the wavelength conversion element 200i provided by FIG. 9, and a difference therebetween is that the orthogonal projection of the surface treatment layer 214i on the base board 212 completely overlaps the base board 212 and completely overlaps an orthogonal projection of a heat conductive layer 240i on the base board 212 in this embodiment. Specifically, the orthogonal projection of the reflective layer 230a on the base board 212 is less than the base board 212 and completely overlaps the orthogonal projection of the wavelength conversion layer 220a on the base board 212. Since the heat conductive layer 240i is distributed on an entire substrate 210i, so that thermal energy may be additionally diffused to a non-wavelength conversion region before being transmitted to the substrate 210i. That is, an area of heat conduction to the substrate 210i is expanded, so that the heat conduction effect is further enhanced.

Figure 12:
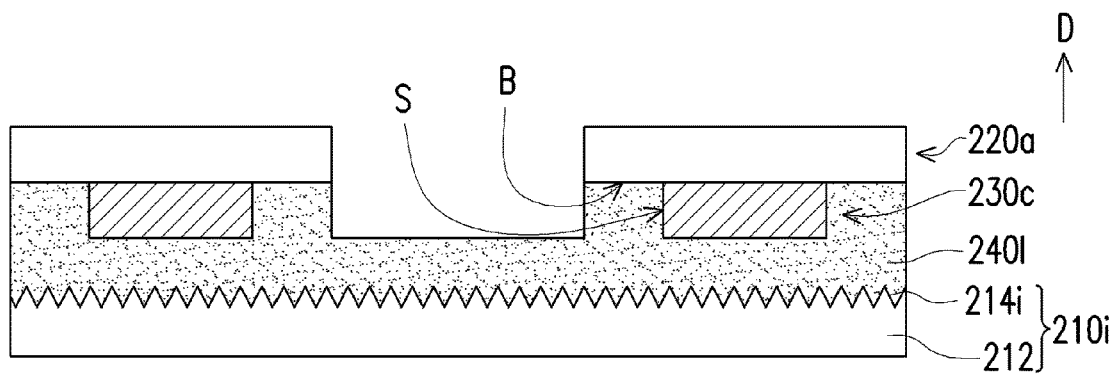

FIG. 12 is a cross-sectional schematic view illustrating a wavelength conversion element according to another embodiment of the disclosure. With reference to FIG. 11 and FIG. 12, a wavelength conversion element 200l provided by this embodiment is similar to the wavelength conversion element 200k provided by FIG. 11, and a difference therebetween is that: a heat conductive layer 240l extends and covers the side surface S of the reflective layer 230c and contacts the bottom surface B of the wavelength conversion layer 220a in the direction D parallel to the optical axis of the excitation light of the wavelength conversion layer 220a. Specifically, the orthogonal projection of the wavelength conversion layer 220a on the base board 212 is less than an orthogonal projection of the heat conductive layer 240l on the base board 212, and the orthogonal projection of the wavelength conversion layer 220a on the base board 212 is greater than an orthogonal projection of the reflective layer 230c on the base board 212.

Figure 13:
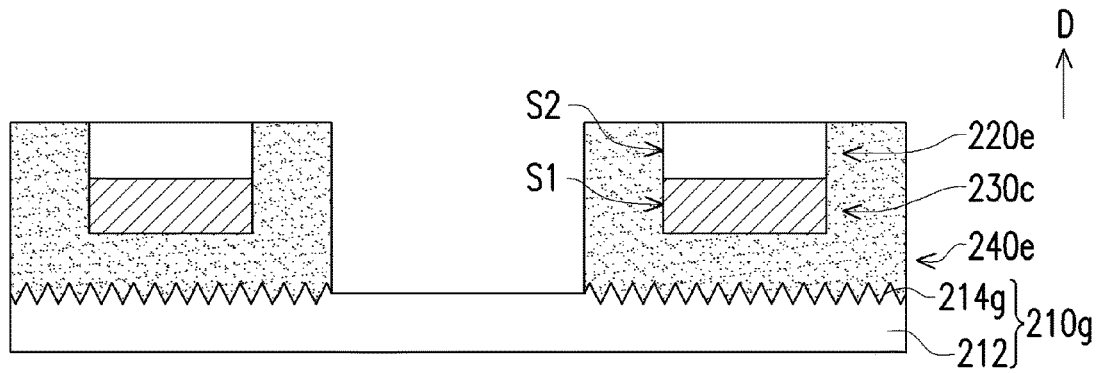

FIG. 13 is a cross-sectional schematic view illustrating a wavelength conversion element according to another embodiment of the disclosure. With reference to FIG. 7 and FIG. 13, a wavelength conversion element 200m provided by this embodiment is similar to the wavelength conversion element 200g provided by FIG. 7, and a difference therebetween is that the heat conductive layer 240e extends and covers the first side surface 51 of the reflective layer 230c and the second side surface S2 of the wavelength conversion layer 220e parallel to the optical axis of the excitation light in the direction D parallel to the optical axis of the excitation light of the wavelength conversion layer 220e. Specifically, the orthogonal projection of the surface treatment layer 214g on the base board 212 is less than the base board 212 and completely overlaps an orthogonal projection of the heat conductive layer 240e on the base board 212 in this embodiment. In this case, the heat conductive layer 240e may be distributed on the second side surface S2 of the wavelength conversion layer 220e, so that thermal energy generated by the wavelength conversion layer 220e during excitation may be directly transmitted to the substrate 210a, and that a favorable heat conduction effect is provided. In addition, since the heat conductive layer 240e may directly contact the first side surface 51 of the reflective layer 230c, the thermal energy accumulated by the reflective layer 230c may also be transmitted to the substrate 210g from a lateral side, and that the heat conduction effect provided by the wavelength conversion element 200m is further enhanced.

Figure 14:
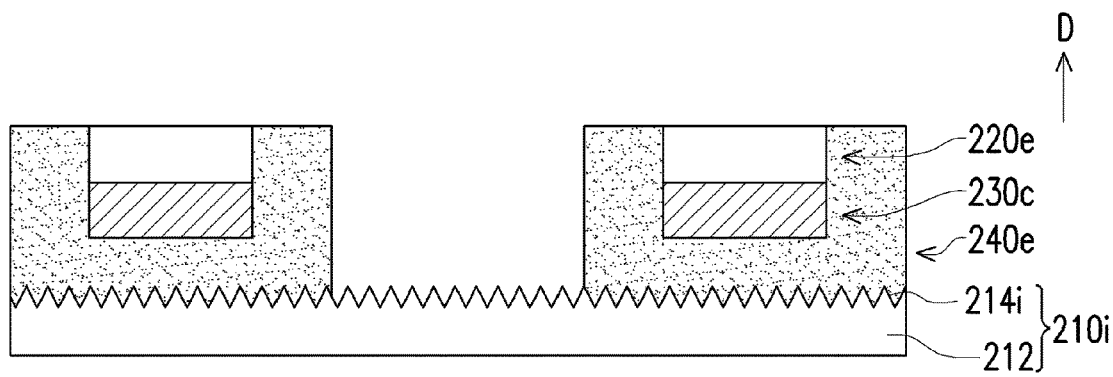

FIG. 14 is a cross-sectional schematic view illustrating a wavelength conversion element according to another embodiment of the disclosure. With reference to FIG. 13 and FIG. 14, a wavelength conversion element 200n provided by this embodiment is similar to the wavelength conversion element 200m provided by FIG. 13, and a difference therebetween is that in this embodiment, the substrate 210i includes the base board 212 and the surface treatment layer 214i, the orthogonal projection of the surface treatment layer 214i on the base board 212 completely overlaps the base board 212, and the orthogonal projection of the heat conductive layer 240e on the base board 212 is less than the base board 212.

Figure 15:
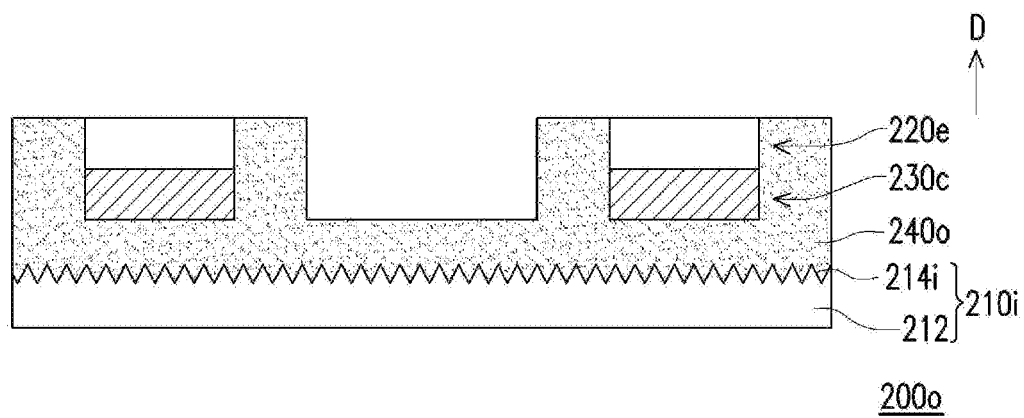

FIG. 15 is a cross-sectional schematic view illustrating a wavelength conversion element according to another embodiment of the disclosure. With reference to FIG. 14 and FIG. 15, a wavelength conversion element 200o provided by this embodiment is similar to the wavelength conversion element 200n provided by FIG. 14, and a difference therebetween is that the orthogonal projection of the surface treatment layer 214i on the base board 212 completely overlaps the base board 212 and completely overlaps an orthogonal projection of a heat conductive layer 240o on the base board 212 in this embodiment. Since the heat conductive layer 240o is distributed on an entire substrate 210i, so that thermal energy may be additionally diffused to a non-wavelength conversion region before being transmitted to the substrate 210i. That is, an area of heat conduction to the substrate 210i is expanded, so that the heat conduction effect is further enhanced.

Figure 16:
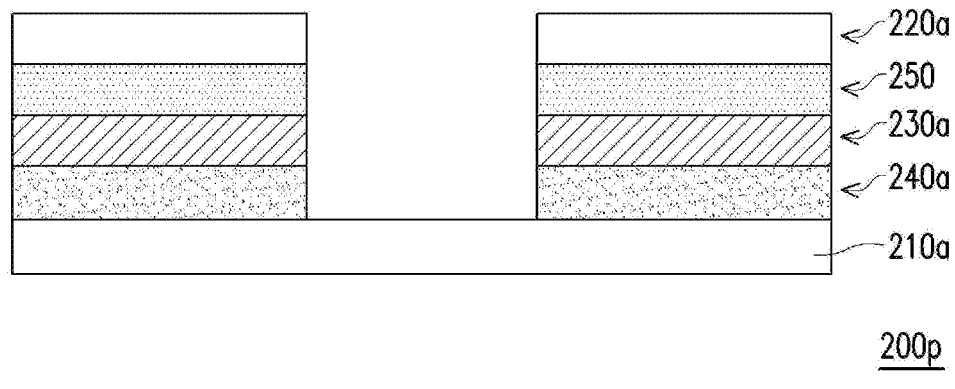

FIG. 16 is a cross-sectional schematic view illustrating a wavelength conversion element according to another embodiment of the disclosure. With reference to FIG. 1B and FIG. 16, a wavelength conversion element 200p provided by this embodiment is similar to the wavelength conversion element 200a provided by FIG. 1B, and a difference therebetween is that the wavelength conversion element 200p provided by this embodiment further includes an adhesive layer 250 disposed on the substrate 210a and located between the wavelength conversion layer 220a and the reflective layer 230a. Note that the adhesive layer 250 provided in FIG. 16 may be additionally added to FIG. 1B to FIG. 15, so that bonding between the wavelength conversion layer and the reflective layer is enhanced, which still belongs to the protection scope of the disclosure.

In view of the foregoing, the embodiments of the disclosure have at least one of the following advantages or effects. In the design of the wavelength conversion element provided by the disclosure, at least a portion of the heat conductive layer is located between the substrate and the reflective layer. In this way, the thermal conductivity of the wavelength conversion element is increased, and that conversion efficiency of the wavelength conversion element is further enhanced. In addition, the projector adopting the wavelength conversion element provided by the disclosure may feature favorable projection quality and product competitiveness.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion element, comprising a substrate, a wavelength conversion layer, a reflective layer, and a heat conductive layer, wherein:
   the wavelength conversion layer is disposed on the substrate,
   the reflective layer is disposed on the substrate and is located between the substrate and the wavelength conversion layer,
   the heat conductive layer is disposed on the substrate, wherein at least a portion of the heat conductive layer is located between the substrate and the reflective layer, and
   the substrate comprises a base board and a surface treatment layer, at least a portion of the surface treatment layer is located between the heat conductive layer and the base board, the surface treatment layer has a non-smooth surface and exhibits a reflective property, and the surface treatment layer is a porous material made of an oxidized material of the base board, wherein the non-smooth surface and an inner portion of the surface treatment layer are filled by the heat conductive layer.

2. The wavelength conversion element according to claim 1, wherein the heat conductive layer comprises a heat conductive material and a filler material.

3. The wavelength conversion element according to claim 2, wherein a thermal conductivity coefficient of the heat conductive material is between 200 W/m·K and 5000 W/m·K.

4. The wavelength conversion element according to claim 3, wherein the heat conductive material comprises graphene, diamond, silver, copper, aluminum, gold, silicon carbide, or a combination of the foregoing.

5. The wavelength conversion element according to claim 2, wherein the filler material comprises silicon dioxide colloid, zirconium dioxide colloid, silicone resin, epoxy resin, ceramic resin, silicone, silica sol, silicate, phosphate, sulfate, borate, or a combination of the foregoing.

6. The wavelength conversion element according to claim 1, wherein an orthogonal projection of the heat conductive layer on the substrate is less than the substrate and completely overlaps an orthogonal projection of the reflective layer on the substrate and an orthogonal projection of the wavelength conversion layer on the substrate.

7. The wavelength conversion element according to claim 1, wherein an orthogonal projection of the heat conductive layer on the substrate is greater than an orthogonal projection of the reflective layer on the substrate.

8. The wavelength conversion element according to claim 7, wherein the orthogonal projection of the heat conductive layer on the substrate completely overlaps the substrate, and the orthogonal projection of the reflective layer on the substrate completely overlaps an orthogonal projection of the wavelength conversion layer on the substrate.

9. The wavelength conversion element according to claim 7, wherein the heat conductive layer extends and covers a side surface of the reflective layer in a direction parallel to an optical axis of excitation light of the wavelength conversion layer.

10. The wavelength conversion element according to claim 9, wherein the heat conductive layer contacts a bottom surface of the wavelength conversion layer, and the orthogonal projection of the heat conductive layer on the substrate completely overlaps an orthogonal projection of the wavelength conversion layer on the substrate.

11. The wavelength conversion element according to claim 9, wherein the orthogonal projection of the heat conductive layer on the substrate completely overlaps the substrate.

12. The wavelength conversion element according to claim 7, wherein the heat conductive layer extends and covers a first side surface of the reflective layer and a second side surface of the wavelength conversion layer in a direction parallel to an optical axis of excitation light of the wavelength conversion layer.

13. The wavelength conversion element according to claim 12, wherein the orthogonal projection of the heat conductive layer on the substrate completely overlaps the substrate.

14. The wavelength conversion element according to claim 1, wherein a material of the base board comprises aluminum, and a material of the surface treatment layer comprises alumina.

15. The wavelength conversion element according to claim 1, wherein an orthogonal projection of the surface treatment layer on the base board is less than the base board and completely overlaps an orthogonal projection of the heat conductive layer on the base board.

16. The wavelength conversion element according to claim 15, wherein the orthogonal projection of the surface treatment layer on the base board completely overlaps an orthogonal projection of the reflective layer on the base board and an orthogonal projection of the wavelength conversion layer on the base board.

17. The wavelength conversion element according to claim 15, wherein in a direction parallel to an optical axis of excitation light of the wavelength conversion layer, the heat conductive layer extends and covers a side surface of the reflective layer and contacts a bottom surface of the wavelength conversion layer, and the orthogonal projection of the heat conductive layer on the base board completely overlaps an orthogonal projection of the wavelength conversion layer on the base board.

18. The wavelength conversion element according to claim 1, wherein an orthogonal projection of the surface treatment layer on the base board completely overlaps the base board.

19. The wavelength conversion element according to claim 18, wherein an orthogonal projection of the heat conductive layer on the base board is less than the base board and completely overlaps an orthogonal projection of the reflective layer on the base board and an orthogonal projection of the wavelength conversion layer on the base board.

20. The wavelength conversion element according to claim 18, wherein in a direction parallel to an optical axis of excitation light of the wavelength conversion layer, the heat conductive layer extends and covers a side surface of the reflective layer and contacts a bottom surface of the wavelength conversion layer, and an orthogonal projection of the heat conductive layer on the base board is less than the base board and completely overlaps an orthogonal projection of the wavelength conversion layer on the base board.

21. The wavelength conversion element according to claim 1, wherein an orthogonal projection of the surface treatment layer on the base board completely overlaps the base board and an orthogonal projection of the heat conductive layer on the base board.

22. The wavelength conversion element according to claim 21, wherein an orthogonal projection of the reflective layer on the base board is less than the base board and completely overlaps an orthogonal projection of the wavelength conversion layer on the base board.

23. The wavelength conversion element according to claim 21, wherein in a direction parallel to an optical axis of excitation light of the wavelength conversion layer, the heat conductive layer extends and covers a side surface of the reflective layer and contacts a bottom surface of the wavelength conversion layer, and an orthogonal projection of the wavelength conversion layer on the base board is less than the orthogonal projection of the heat conductive layer on the base board and greater than an orthogonal projection of the reflective layer on the base board.

24. The wavelength conversion element according to claim 1, wherein in a direction parallel to an optical axis of excitation light of the wavelength conversion layer, the heat conductive layer extends and covers a first side surface of the reflective layer and a second side surface of the wavelength conversion layer parallel to the optical axis of the excitation light.

25. The wavelength conversion element according to claim 24, wherein an orthogonal projection of the surface treatment layer on the base board is less than the base board and completely overlaps an orthogonal projection of the heat conductive layer on the base board.

26. The wavelength conversion element according to claim 24, wherein an orthogonal projection of the surface treatment layer on the base board completely overlaps the base board, and an orthogonal projection of the heat conductive layer on the base board is less than the base board.

27. The wavelength conversion element according to claim 24, wherein an orthogonal projection of the surface treatment layer on the base board completely overlaps the base board and an orthogonal projection of the heat conductive layer on the base board.

28. The wavelength conversion element according to claim 1, further comprising:
an adhesive layer, disposed on the substrate and located between the wavelength conversion layer and the reflective layer.

29. A projector, comprising a light-emitting unit, a wavelength conversion element, a light valve, and a projection lens, wherein:
the light-emitting unit is configured to emit an illumination light beam,
the wavelength conversion element is disposed on a transmission path of the illumination light beam, and the wavelength conversion element comprises a substrate, a wavelength conversion layer, a reflective layer, and a heat conductive layer, wherein:
the wavelength conversion layer is disposed on the substrate,
the reflective layer is disposed on the substrate and is located between the substrate and the wavelength conversion layer,
the heat conductive layer is disposed on the substrate, wherein at least a portion of the heat conductive layer is located between the substrate and the reflective layer, and
the substrate comprises a base board and a surface treatment layer, at least a portion of the surface treatment layer is located between the heat conductive layer and the base board, the surface treatment layer has a non-smooth surface and exhibits a reflective property, and the surface treatment layer is a porous material made of an oxidized material of the base board, wherein the non-smooth surface and an inner portion of the surface treatment layer are filled by the heat conductive layer;
the light valve is disposed on the transmission path of the illumination light beam and is configured to convert the illumination light beam into an image light beam, and the projection lens is disposed on a transmission path of the image light beam and is configured to project the image light beam.

* * * * *